United States Patent
Chen et al.

(10) Patent No.: US 8,590,857 B2
(45) Date of Patent: Nov. 26, 2013

(54) STRUCTURE OF SUPPORT FRAME FEATURING FAST WARPING AND CLOSING

(76) Inventors: Ko-An Chen, Taipei (TW); Hyun Jong Kim, Taipei (TW)

(*) Notice: Subject to any disclaimer, the term of this patent is extended or adjusted under 35 U.S.C. 154(b) by 162 days.

(21) Appl. No.: 13/304,393

(22) Filed: Nov. 24, 2011

(65) Prior Publication Data

US 2013/0134274 A1 May 30, 2013

(51) Int. Cl.
*H05K 5/00* (2006.01)

(52) U.S. Cl.
USPC .................... 248/690; 248/218.4; 24/3.1

(58) Field of Classification Search
USPC ........ 248/218.1, 230.1, 230.7, 689, 690, 691, 248/692, 125.9, 514, 515, 516, 181.1, 248/181.2, 182.1, 288.31, 288.51; 24/3.1, 24/3.2, 3.11, 3.12, 458, 326
See application file for complete search history.

(56) References Cited

U.S. PATENT DOCUMENTS

| | | | | |
|---|---|---|---|---|
| 5,738,398 A * | 4/1998 | Miano | ......................... | 294/166 |
| 7,915,554 B2 * | 3/2011 | Ueda et al. | .................... | 200/315 |
| 7,942,293 B2 * | 5/2011 | Lawrence et al. | ............. | 224/218 |
| 2001/0031322 A1 * | 10/2001 | Sloot | ............................... | 428/17 |
| 2013/0056602 A1 * | 3/2013 | Zivku | ........................... | 248/339 |

* cited by examiner

*Primary Examiner* — Steven Marsh
(74) *Attorney, Agent, or Firm* — Leong C. Lei (57) ABSTRACT

A structure of support frame featuring fast warping up and closing is mountable to a back surface of an electronic device and includes a cover and at least one bendable mechanism. The cover is mounted to the back surface of the electronic device. The bendable mechanism is mounted to the back surface of the cover and includes at least one deformable plate that is curved and shows a circular arc form. The deformable plate is provided with a depression spot. As such, pressing down the depression spot causes the deformable plate that is of a circular arc form to undergo flattening deformation, making ends of the deformable plate fast warping up in an outward direction. With the warping portions of the deformable plate, a function of supporting or clamping can be realized to hold the electronic device on an object or be worn on a human body.

10 Claims, 13 Drawing Sheets

STRUCTURE OF SUPPORT FRAME FEATURING FAST WARPING AND CLOSING

TECHNICAL FIELD OF THE INVENTION

The present invention generally relates to a structure of support frame featuring fast warping and closing, and more particularly to an audio playing device that is turned on or off by existing wiring to start or stop playing digital audio files automatically.

DESCRIPTION OF THE PRIOR ART

The mature of development of electronic technology and network technology makes the traditional electronic devices (such as pushbutton based communication devices or notebook computers) gradually replaced by widely used smart mobile phones (such as iPhone) and tablet computers (such as iPad).

The smart mobile phones (such as iPhone) and tablet computers (such as iPad) provide a function of multimedia entertainment. For example, the smart phones may be connected with the Internet to allow users to browse websites or download various sorts of multimedia information, such as music, movies, and games. As a consequence, the users spend more time in operating or watching the smart phones or tablet computers and this makes the users to hold a smart phone or a tablet computer with a hand for a very long period of time. This causes inconvenience of use and also affects the quality of viewing a movie with a smart phone or a tablet computer for shaking may be easily caused when the smart phone or the tablet computer is held by hands.

Manufacturers have developed retention frames for smart phones and tablet computers to allow the smart phones and the tablet computers to be retained, in a substantially upright manner, on for example a desktop and thus preventing the users to hand hold the smart phones or tablet computers for a long time and eliminating the potential problem of shaking and inconvenience of use. However, although those conventional retention frames are capable of supporting the smart phones and tablet computers on desktops, yet those retention frames are often bulky and cannot be unitarily combined with the smart phone or tablet computer, so that a user must additionally carry the retention frame. This causes inconvenience of carrying and use.

SUMMARY OF THE INVENTION

In view of the above problems, the present invention provides a structure of support frame featuring fast warping and closing in order to overcome the problems that the conventional retention frames for smart phones and tablet computers are generally bulky and cannot be unitarily combined with the smart phone or tablet computer so that a user must additionally carry the retention frame and inconvenience of use is caused.

The primary objective of the present invention is to disclose a structure of support frame featuring fast warping and closing, which is mountable to a back surface of an electronic device and comprises a cover and at least one bending structure. The cover is mounted to the back surface of the electronic device. The bendable mechanism is mounted to the back surface of the cover and comprises at least one deformable plate and an abutment strip. The deformable plate has a cross-section showing a curved circular arc configuration. The deformable plate is provided with a depression spot. The abutment strip is arranged under the deformable plate and distant from the depression spot. As such, when the structure of support frame is not put into use, the deformable plate of the bendable mechanism lies flat on the back face of the cover; and when it is attempted to use the structure of support frame, the depression spot of the deformable plate is depressed to force the deformable plate that is of a curved circular arc configuration to undergo fast flattening deformation, making ends of the deformable plate warping up in an outward direction. A function of supporting or clamping can then be realized with the warping portions of the deformable plate and the electronic device attached thereto can then be held on an object (such as a desk) or worn on a human body (such as a hand) to thereby improve the functionality, applicability, and convenience of the structure of support frame.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 13:
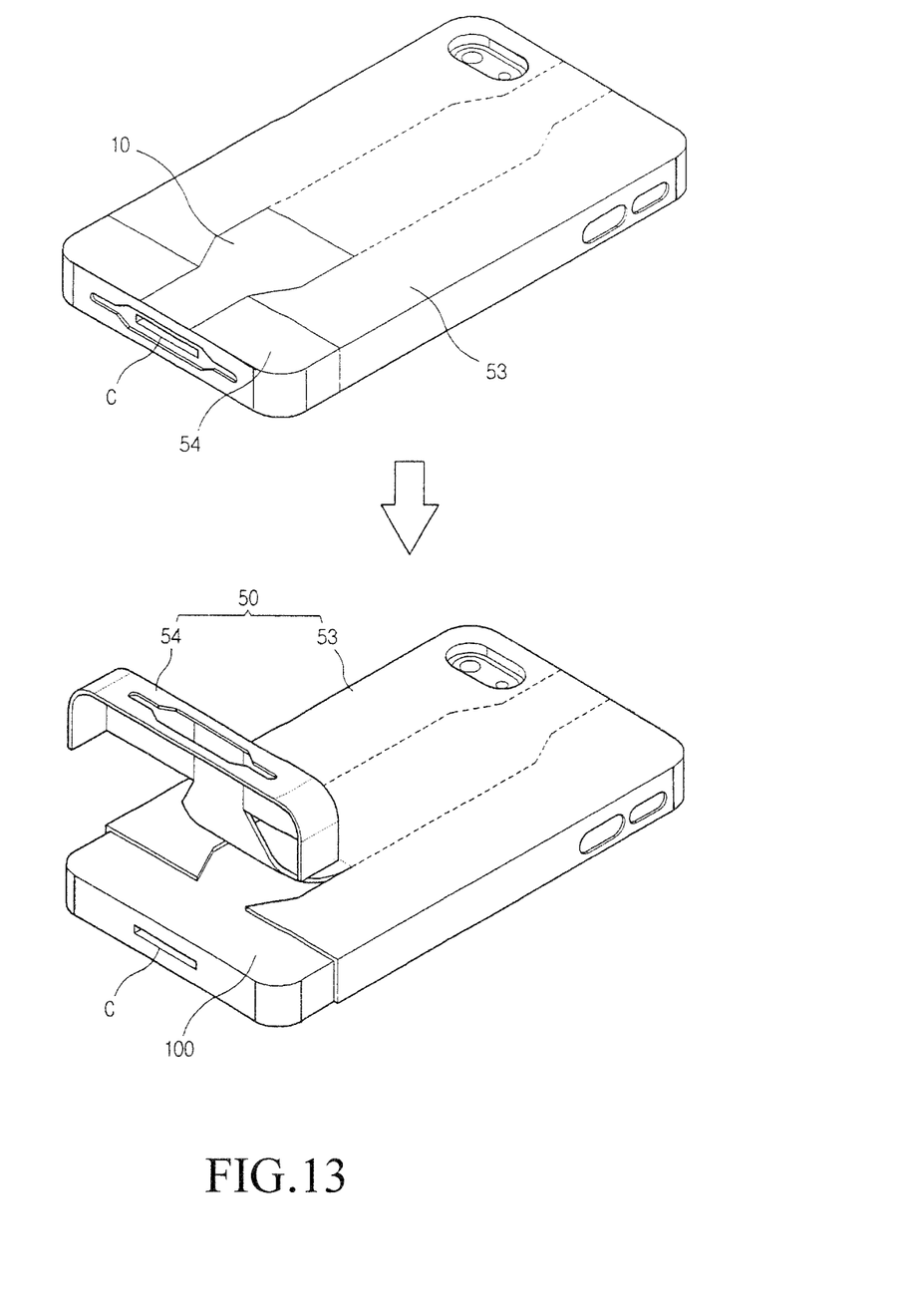
FIG. 13 is a perspective view of a structure of support frame according to a sixth embodiment of the present invention.

Referring to FIGS. 1, 2, 2A, 3, 4, and 5, the present invention discloses a structure of support frame featuring fast warping and closing, which is mountable to a back surface of an electronic device 100 (as shown in FIG. 13). The structure of support frame comprises a cover 50 and at least one bendable mechanism 1.

The cover 50 is mounted to the back surface of the electronic device 100 (as shown in FIG. 13). The cover 50 comprises an upper cover member 51 and a lower cover member 52. The upper cover member 51 forms at least one opening 51a. The lower cover member 52 has a back face 52a, and the upper cover member 51 is mounted to the back face 52a of the lower cover member 52.

Figure 8:
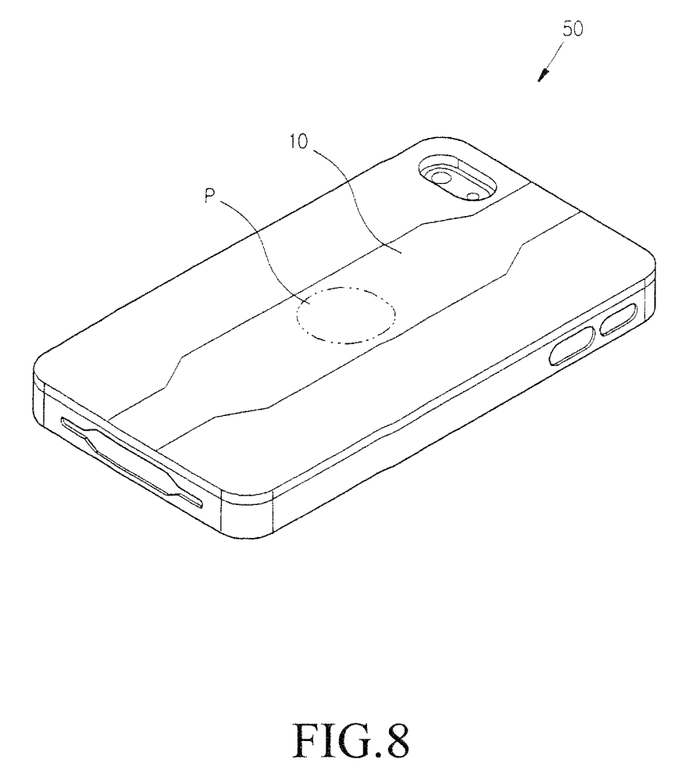
FIG. 8 is a perspective view of a structure of support frame according to a third embodiment of the present invention.

The bendable mechanism 1 is mounted to a back surface of the cover 50 and comprises at least one deformable plate 10, at least one abutment strip 20, and a support strip 13. The deformable plate 10 is a strip-like plate and has a cross-section showing a curved circular arc configuration. The deformable plate 10 is provided with a depression spot P thereon. The abutment strip 20 has a surface that is of a circular arc configuration and the abutment strip 20 is arranged under the deformable plate 10 is spaced away from the depression spot P. Further, the abutment strip 20 is oriented in the same direction as the deformable plate 10. The support strip 13 has a surface that is of a circular arc configuration and the support strip 13 is arranged under the deformable plate 10 and corresponding to the depression spot P. Further, the support strip 13 is oriented in a direction substantially perpendicular to and intersecting the deformable plate 10. The bendable mechanism 1 is arranged on the back surface of the cover 50 and is located between the upper cover member 51 and the lower cover member 52. The deformable plate 10 and the abutment strip 20 of the bendable mechanism 1 are located at a position corresponding to the opening 51a of the upper cover member 51. Further, the deformable plate 10 can be alternatively configured in the form that is reduced in each of two opposite ends and expanded in a middle portion (as shown in FIG. 8).

Figure 1:
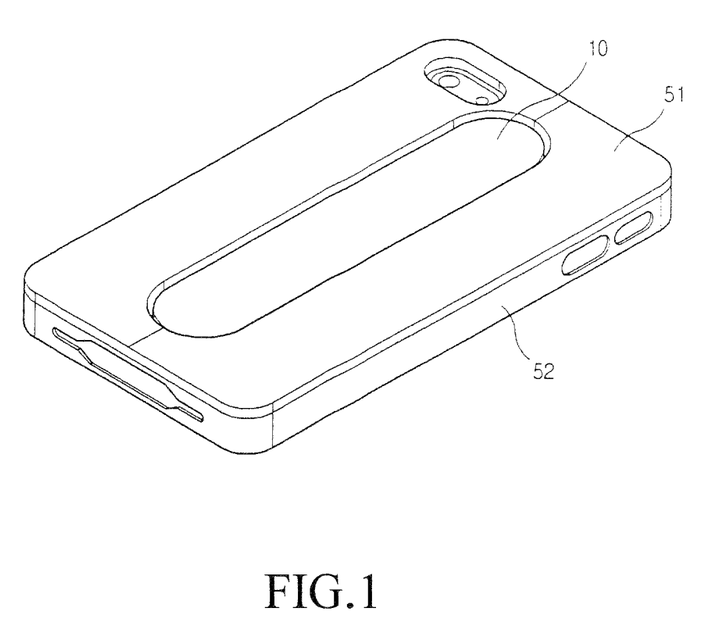
FIG. 1 is a perspective view of a structure of support frame according to a first embodiment of the present invention in an assembled form.
Figures 2, 2A:
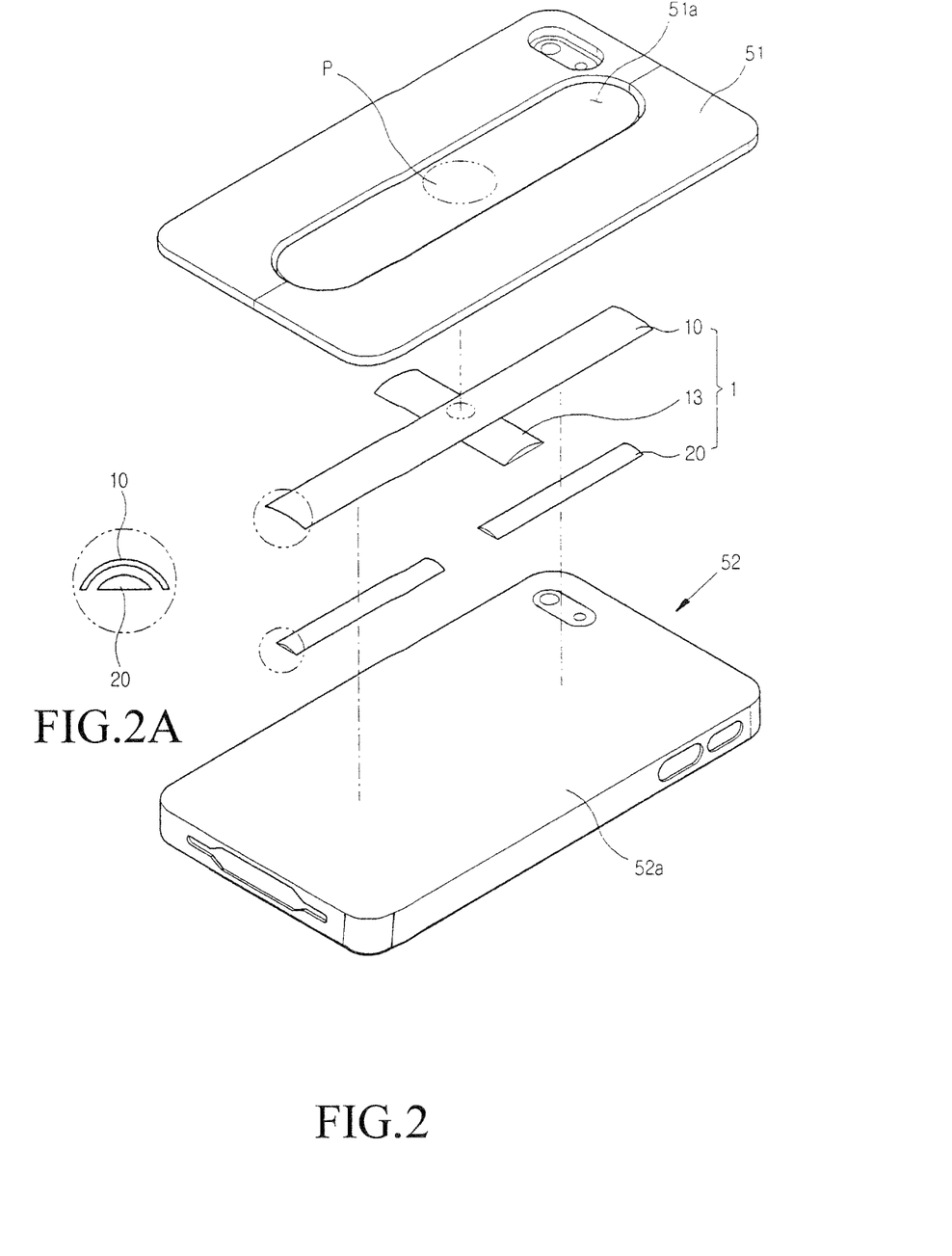
FIG. 2 is an exploded view of the structure of support frame according to the first embodiment of the present invention.
FIG. 2A is an enlarged view of a portion of FIG. 2.
Figure 3:
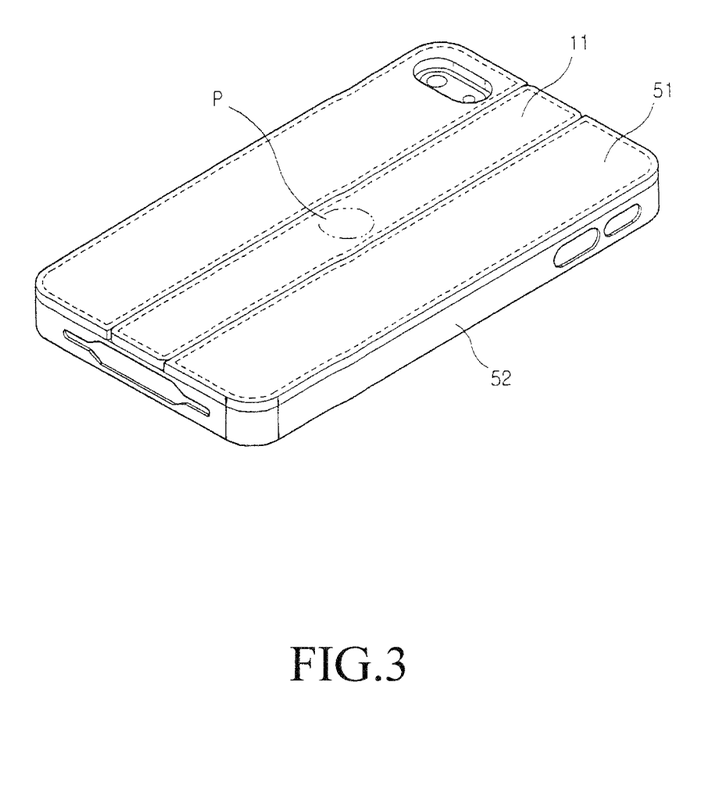
FIG. 3 is a perspective view of a structure of support frame according to a second embodiment of the present invention.

Also referring to FIG. 3, the deformable plate 10 of the bendable mechanism 1 may be enclosed by a covering layer (such as fabric, natural leather and the likes) to form a retention and support section 11 of the bendable mechanism 1. The upper cover member 51 of the cover 50 may also be enclosed by a covering layer (such as fabric, natural leather, and the likes).

Figure 4:
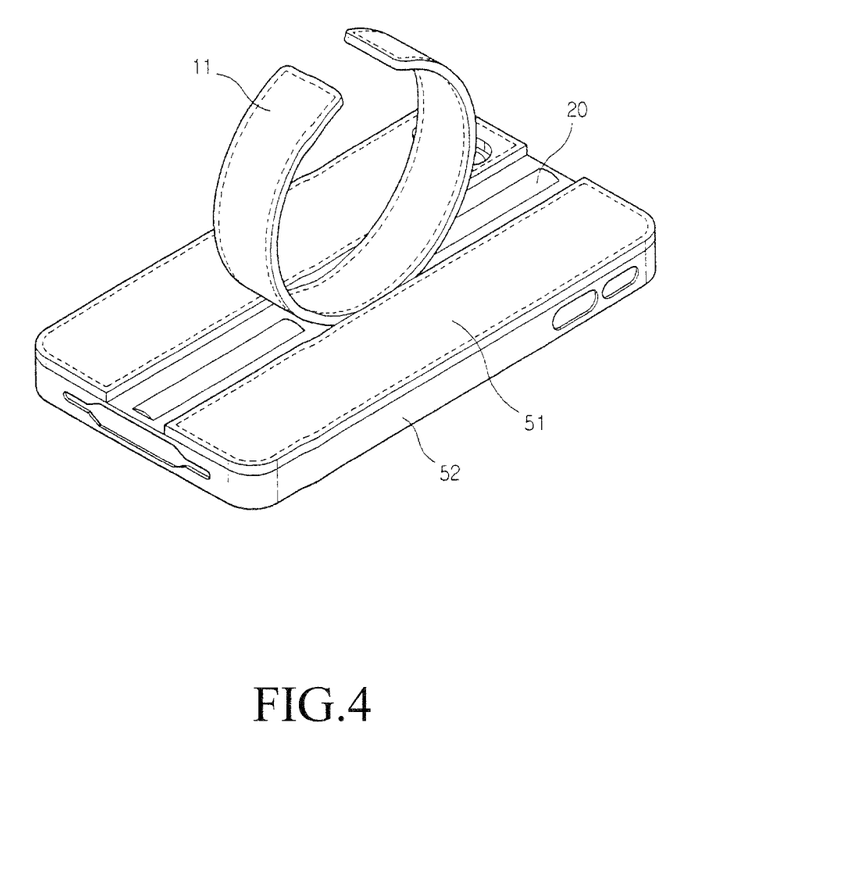
FIG. 4 is a perspective view showing the operation of the structure of support frame according to the second embodiment of the present invention.
Figure 5:
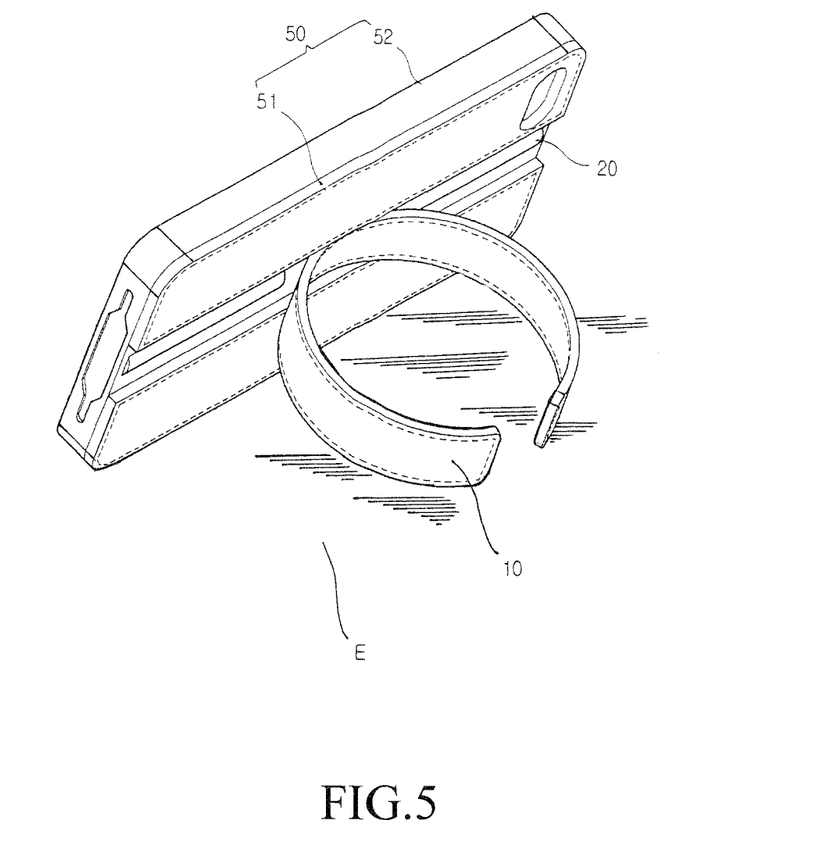
FIG. 5 is a perspective view showing a first way of use of the structure of support frame according to the second embodiment of the present invention.
Figure 6:
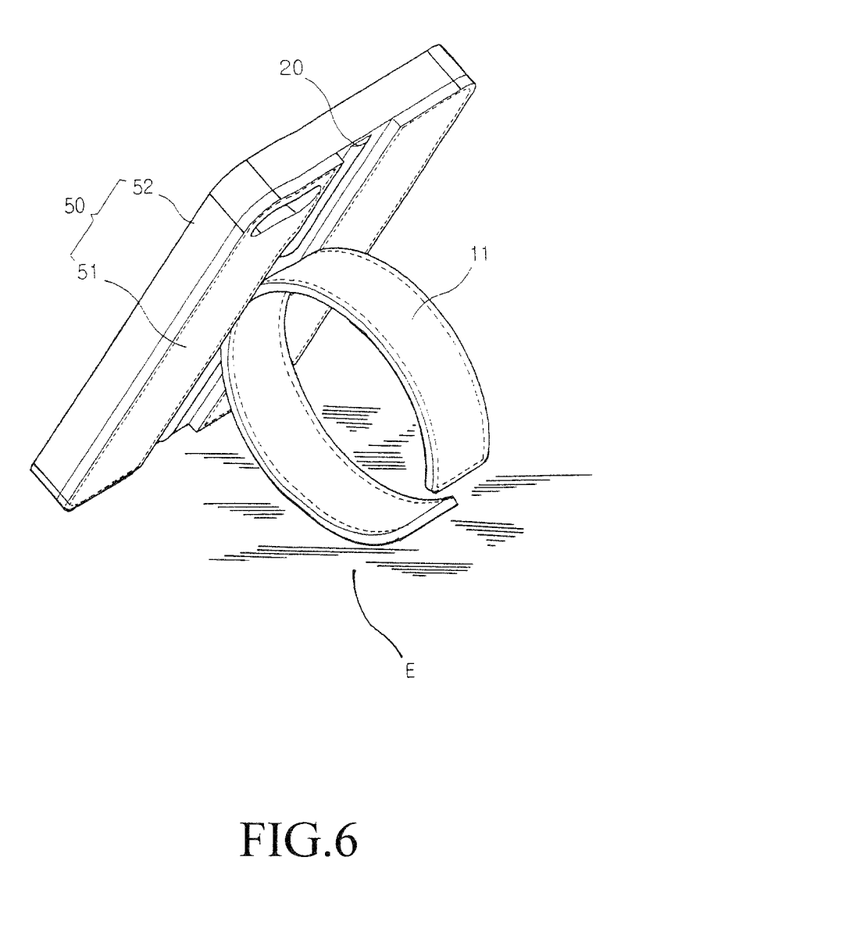
FIG. 6 is a perspective view showing a second way of use of the structure of support frame according to the second embodiment of the present invention.

Referring to FIGS. 4, 5, and 6, when the structure of support frame according to the present invention is not put into use, the deformable plate 10 (namely the retention and support section 11) of the bendable mechanism 1 lies flat on the back face 52a of the cover 50 to allow the cover 50, when mounted to the electronic device 100, to serve as a regular protection casing for the electronic device. When it is attempted to use the structure of support frame according to the present invention, the depression spot P of the deformable plate 10 (namely the retention and support section 11) is depressed to force the deformable plate 10 (namely the retention and support section 11) that is of a curved circular arc configuration to undergo flattening deformation, making ends of the deformable plate 10 (namely the retention and support section 11) fast warping up in an outward direction. A support function can then be realized with the warping portions of the deformable plate 10 (namely the retention and support section 11). As such, the electronic device 100 may use the deformable plate 10 (namely the retention and support section 11) of the cover 50 to serve as a support in order to hold the electronic device 100, in either a horizontal way or a vertical way, on an object E (such as a desk), as shown in FIGS. 5 and 6.

Figure 7:
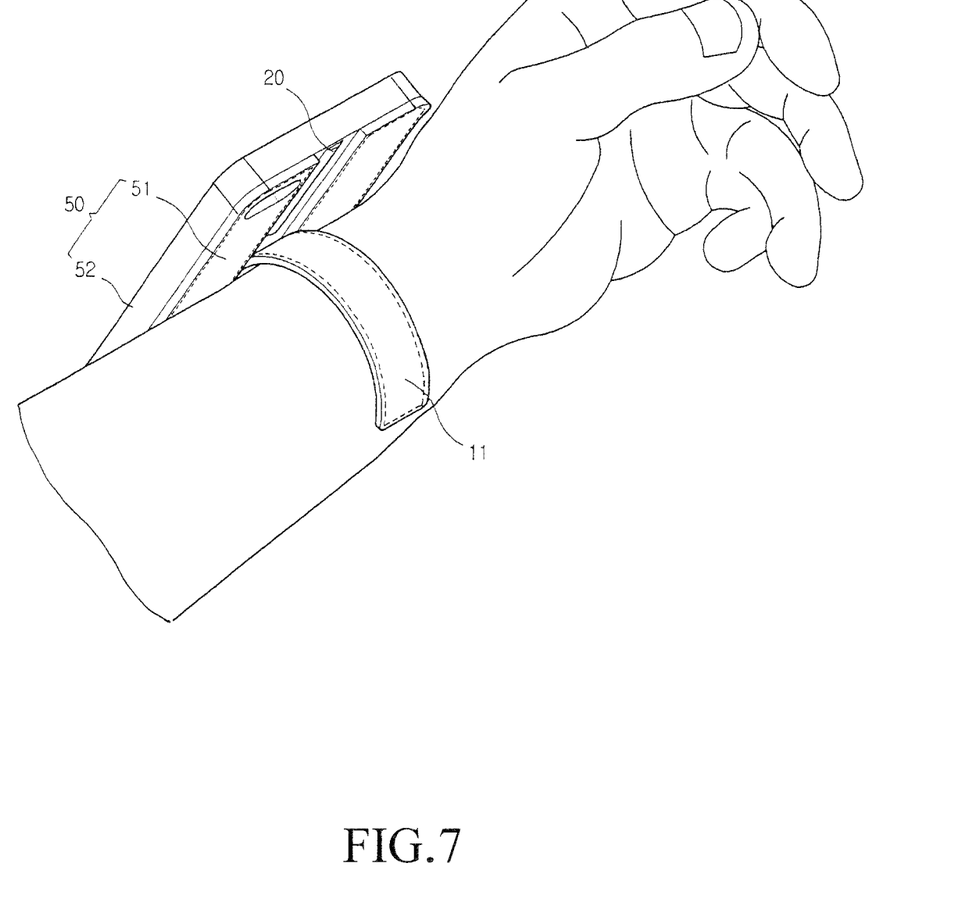
FIG. 7 is a perspective view showing a third way of use of the structure of support frame according to the second embodiment of the present invention.

Also referring to FIG. 7, with the ends of the deformable plate 10 (namely the retention and support section 11) being fast warping up in the outward direction, the deformable plate 10 (namely the retention and support section 11) of the cover 50 can provide a function of clamping so as to allow the cover 50 (including the electronic device 100) to be worn on a human body (such as a hand).

Figure 9:
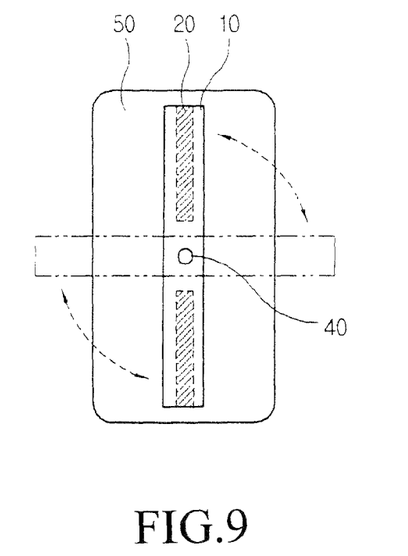
FIG. 9 is a perspective view showing a fourth way of use of the structure of support frame according to the second embodiment of the present invention.

Referring to FIG. 9, the present invention may further comprises a rotation axle 40 formed at the depression spot P of the deformable plate 10, so that the deformable plate 10 is allowed to rotate on the cover 50 for changing direction.

Figure 10:
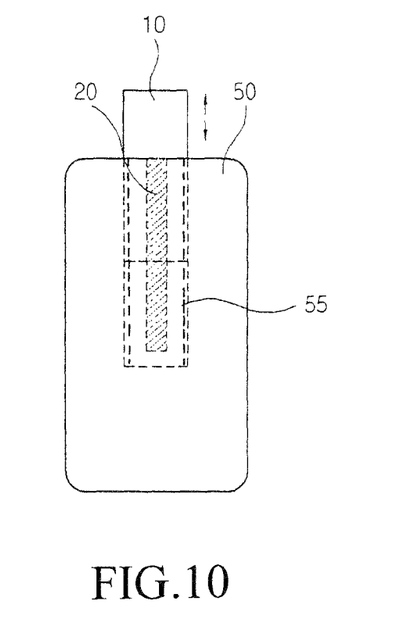
FIG. 10 is a schematic view of a structure of support frame according to a fourth embodiment of the present invention.
Figure 11:
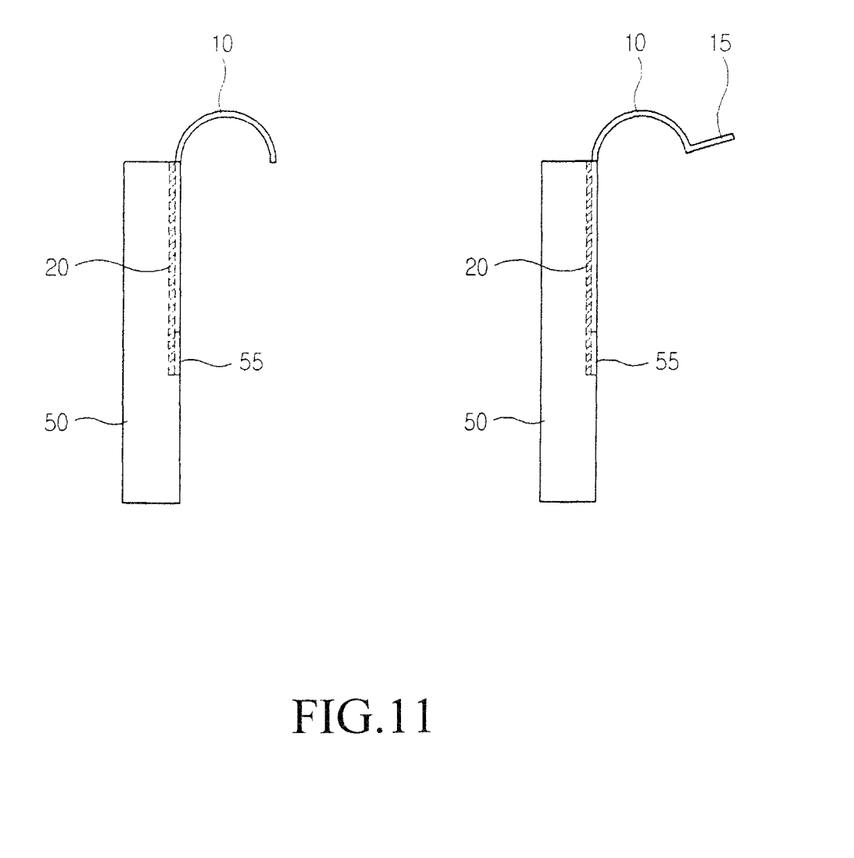
FIG. 11 is a schematic view showing a way of use of the structure of support frame according to the fourth embodiment of the present invention.

Referring to FIGS. 10 and 11, the present invention further comprises a slide channel 55 formed in the cover 50 and the deformable plate 10 is received in the slide channel 55, so that the deformable plate 10 may be operated to displace and extend or retract in the slide channel 55. The deformable plate 10, when located outside the slide channel 55, can undergo flattening deformation to make the ends of the deformable plate 10 fast warping up in the outward direction. The warping and thus curved the deformable plate 10 allows the cover 50 to be suspended on an object. Further, a curved section 15 is formed by extending from an end of the deformable plate 10.

Figure 12:
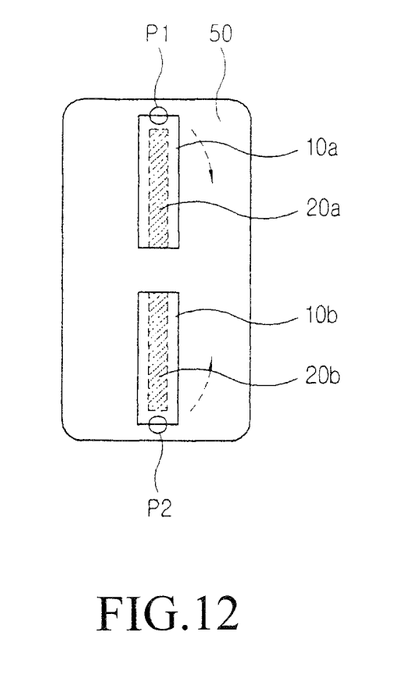
FIG. 12 is a schematic view of a structure of support frame according to a fifth embodiment of the present invention.

As shown in FIG. 12, the bendable mechanism 1 may comprises at least two or more than two deformable plates 10a, 10b and at least two or more than two abutment strips 20a, 20b. Each of the deformable plates 10 is provided with a depression spot P1, P2. At least one abutment strip 20a, 20b is arranged under each of the deformable plates 10a, 10b. The abutment strips 20a, 20b are arranged distant from the depression spots P1, P2, so that depressing the depression spot P1, P2 of each of the deformable plates 10a, 10b makes the ends of the deformable plate 10a, 10b fast warping up in the outward direction. A support function can then be realized with the warping portions of the deformable plates 10a, 10b.

Referring to FIG. 13, the cover 50 is mountable to the back surface of an electronic device 100 and the cover 50 further comprises a first cover section 53 and a second cover section 54. The first cover section 53 and the second cover section 54 are connected to each other by the deformable plate 10, whereby when the deformable plate 10 is depressed, the ends of the deformable plate 10 can fast warp up in the outward direction to cause the second cover section 54 to move upward, realizing a function of automatically opening the second cover section 54 to allow a user to efficiently remove out the electronic device 100.

Figure 14:
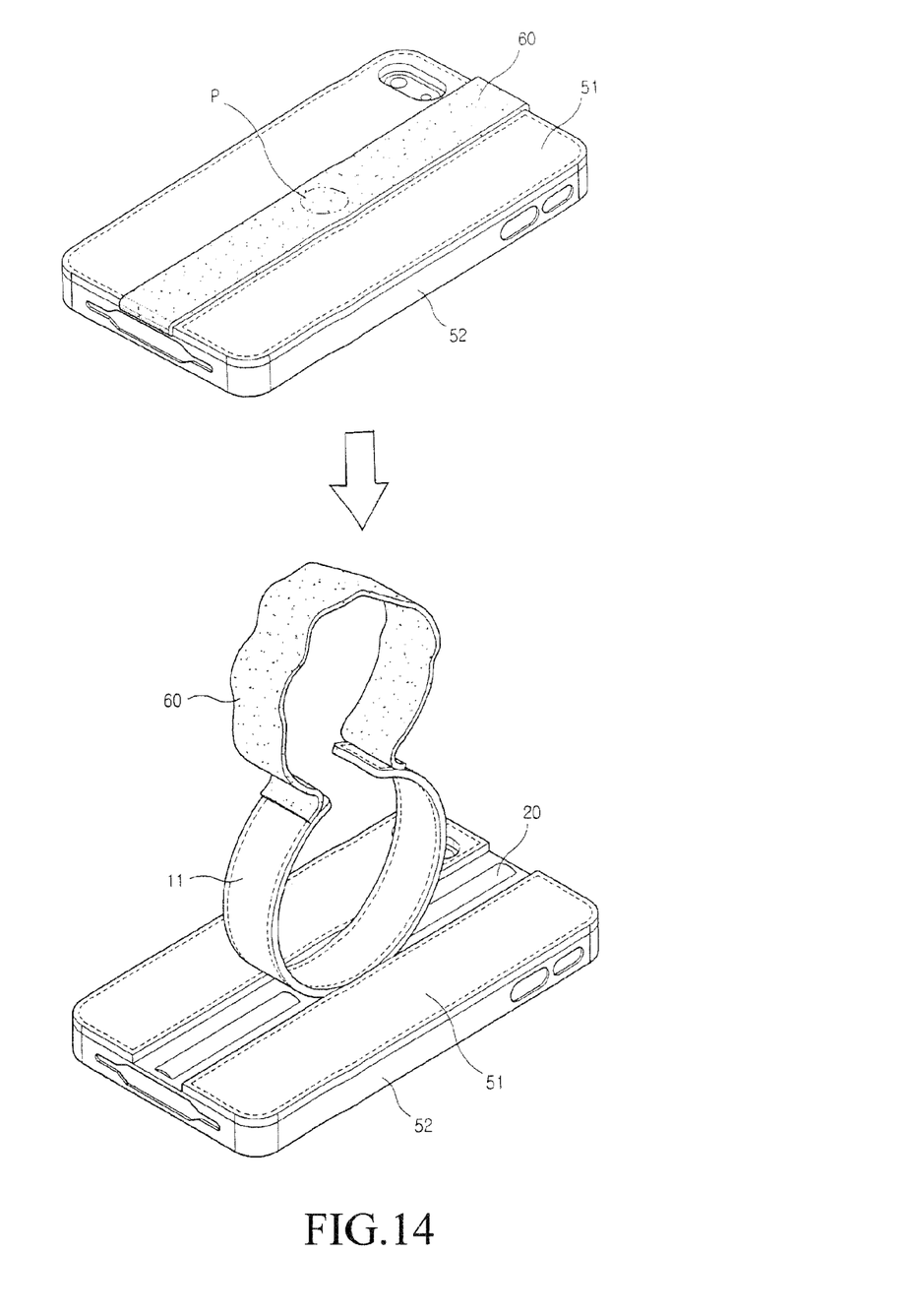
FIG. 14 is a perspective view of a structure of support frame according to a seventh embodiment of the present invention.

Referring to FIG. 14, the present invention comprises a band 60 connecting between the ends of the deformable plate 10 (namely the retention and support section 11). With the ends of the deformable plate 10 (namely the retention and support section 11) being fast warping up in the outward direction, the connection between the deformable plate 10 (namely the retention and support section 11) and the band 60 may constitute a derivative protection band that firmly retains the electronic device 10 on a human body (such as a hand) and protects against undesired separation.

In summary, the features of the present invention are that a cover 50 has a back face 52a to which at least one bendable mechanism 1 is mounted and the bendable mechanism 1 comprises at least one deformable plate 10 having ends that can warp up in an outward direction so that with the warping portions of the deformable plate 10, a function of supporting or clamping can be realized to allow the electronic device 100 to stand on an object (such as desk) or be worn on a human body (such as a hand) to improve the functionality, applicability, and convenience of the structure of support frame according to the present invention.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A structure of support frame featuring fast warping and closing adapted to be mounted to a back surface of an electronic device, the structure of support frame comprising:
    a cover, which is mountable to the back surface of the electronic device;
    at least one bendable mechanism, which is mounted to a back surface of the cover and comprises at least one deformable plate and at least one abutment strip, the deformable plate comprising a depression spot, the abutment strip being arranged under the deformable plate and distant from the depression spot;
    wherein pressing down the depression spot causes the deformable plate to undergo deformation and makes the deformable plate fast warp up in an outward direction.

2. The structure of support frame featuring fast warping and closing according to claim 1, wherein the deformable plate has a cross-section showing a curved circular arc configuration.

3. The structure of support frame featuring fast warping and closing according to claim 2, wherein the deformable plate has two ends that are warpable up in an outward direction.

4. The structure of support frame featuring fast warping and closing according to claim 3, wherein the deformable plate is configured in a form that is reduced in each of two opposite ends and expanded in a middle portion.

5. The structure of support frame featuring fast warping and closing according to claim 1 or 4, wherein the depression spot of the deformable plate is provided with a rotation axle.

6. The structure of support frame featuring fast warping and closing according to claim 1, wherein the deformable plate is enclosed by a covering layer and an upper cover member of the cover is enclosed by a covering layer.

7. The structure of support frame featuring fast warping and closing according to claim 1, wherein the cover comprise a first cover section and a second cover section, the first cover section and the second cover section being connected to each other by the deformable plate.

8. The structure of support frame featuring fast warping and closing according to claim 1, wherein the cover comprise an upper cover member and a lower cover member, the upper cover member forming at least one opening, the lower cover member having a back face, the upper cover member being mounted to the back face of the lower cover member, the deformable plate and the abutment strip of the bendable mechanism being located at a position corresponding to the opening of the upper cover member.

9. The structure of support frame featuring fast warping and closing according to claim 1, wherein the deformable plate has two ends that are connected by a band.

10. The structure of support frame featuring fast warping and closing according to claim 1, wherein the bendable mechanism further comprises a support strip, the support strip being arranged under the deformable plate to correspond to the depression spot, the support strip being arranged substantially perpendicular to and intersecting the deformable plate.

* * * * *